(12) United States Patent
Watanabe

(10) Patent No.: US 12,129,131 B2
(45) Date of Patent: Oct. 29, 2024

(54) SUCTION HOLDING TABLE AND PROCESSING APPARATUS

(71) Applicant: DISCO CORPORATION, Tokyo (JP)

(72) Inventor: Yuki Watanabe, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 295 days.

(21) Appl. No.: 17/660,453

(22) Filed: Apr. 25, 2022

(65) Prior Publication Data

US 2022/0356022 A1  Nov. 10, 2022

(30) Foreign Application Priority Data

May 6, 2021 (JP) ................................ 2021-078408

(51) Int. Cl.
*B25B 11/00* (2006.01)
*B65G 47/91* (2006.01)
(52) U.S. Cl.
CPC .................................... *B65G 47/91* (2013.01)
(58) Field of Classification Search
CPC ........ B25B 11/00; B25B 11/005; B65G 47/91
See application file for complete search history.

(56) References Cited

U.S. PATENT DOCUMENTS

| | | | | |
|---|---|---|---|---|
| 6,184,972 B1* | 2/2001 | Mizutani | ............... | G03F 7/7075 269/21 |
| 6,247,891 B1* | 6/2001 | Lind | ....................... | B01L 9/543 414/811 |
| 8,003,919 B2* | 8/2011 | Goto | .................... | H01L 21/6838 219/390 |
| 11,524,392 B2* | 12/2022 | Ahamed | ............... | B25B 11/005 |
| 2016/0111318 A1* | 4/2016 | Ichinose | ............. | G03F 7/70733 269/21 |
| 2022/0356022 A1* | 11/2022 | Watanabe | .............. | B65G 47/91 |

FOREIGN PATENT DOCUMENTS

JP  2004255568 A  9/2004

* cited by examiner

*Primary Examiner* — Lee D Wilson
(74) *Attorney, Agent, or Firm* — Greer Burns & Crain Ltd.

(57) ABSTRACT

A suction holding table for holding a holdable object under suction includes a base seat rotatable about a rotational axis, and a plurality of holders erected from the base seat and angularly spaced at equal angular intervals along a circle around the rotational axis, in which each of the holders has an upper surface functioning as a holding surface with a suction port defined therein, and attract the holdable object to the holder under a negative pressure applied via the suction port.

19 Claims, 7 Drawing Sheets

SUCTION HOLDING TABLE AND PROCESSING APPARATUS

BACKGROUND OF THE INVENTION

Field of the Invention

The present invention relates to a suction holding table capable of holding a warped plate-shaped workpiece under suction and a processing apparatus, including such a suction holding table, for processing a warped plate-shaped workpiece.

Description of the Related Art

In a process of manufacturing device chips to be incorporated in electronic devices, a plurality of devices such as integrated circuits (ICs) or large-scale integration (LSI) circuits are formed on a face side of a wafer made of a semiconductor or the like. Thereafter, the wafer is cut along areas thereof that include the respective devices, producing individual device chips. Recent years have seen accelerating trends toward smaller and lighter electronic devices for incorporating device chips, requiring the device chips to be thinner so that they can neatly be assembled in the electronic devices. Consequently, before a wafer with devices formed on its face side is diced into device chips, a reverse side of the wafer is ground by a grinding apparatus to thin down the wafer.

The grinding apparatus includes a holding unit having a chuck table for holding a workpiece such as a wafer under suction thereon and a grinding unit for grinding the workpiece held under suction on the chuck table. The grinding unit includes a grinding wheel with grindstones mounted in an annular array on its lower surface and a spindle connected to the grinding wheel for rotating the grinding wheel about its central axis. When the grinding wheel is rotated about its central axis by the spindle to move the grindstones along an annular path and is lowered to bring the grindstones into abrasive contact with a surface to be processed of the workpiece, the workpiece is ground by the grindstones. In order for the grinding apparatus to perform high-precision processing on the workpiece, the workpiece needs to be placed accurately in a predetermined position on the holding unit. Therefore, before the workpiece is delivered to the holding unit, the position of the workpiece is accurately adjusted on a positioning table (see, for example, JP 2004-255568A).

SUMMARY OF THE INVENTION

Wafers as workpieces to be ground by the grinding apparatus may occasionally be warped depending on a material and a thickness of the wafers and the structural details of devices formed on the face sides thereof. It is not easy to accurately adjust the position of a warped workpiece whose outer circumferential portion is lifted due to the warpage of the workpiece on the positioning table disclosed in JP 2004-255568A. One solution would be to hold a warped workpiece under suction on the holding surface of a suction holding table to correct the workpiece out of its warpage, detect the position of the corrected workpiece, and adjust the position of the workpiece, for example. However, when the holding surface of the suction holding table for holding the workpiece under suction thereon is of a size commensurate with the diameter of the workpiece, then a suction force, i.e., a negative pressure, applied to the holding surface tends to leak via a gap between the holding surface and the workpiece at an outer circumferential edge of the holding surface. A suction holding table having a smaller-diameter holding surface may be used to hold a less warped central portion of a workpiece. However, such a suction holding table is unable to correct the workpiece out of its warpage because the smaller-diameter holding surface of the suction holding table does not hold the outer circumferential portion of the workpiece. Consequently, it is still difficult for the suction holding table with the smaller-diameter holding surface to accurately adjust the position of the workpiece that remains warped.

It is therefore an object of the present invention to provide a suction holding table capable of holding a warped holdable object under suction and a processing apparatus, including such a suction holding table, for accurately adjusting the position of a warped holdable object and processing the warped holdable object.

In accordance with an aspect of the present invention, there is provided a suction holding table for holding a holdable object under suction thereon, including a base seat rotatable about a rotational axis, and a plurality of holders erected from the base seat and angularly spaced at equal angular intervals along a circle around the rotational axis. Each of the holders has an upper surface functioning as a holding surface with a suction port defined therein and attracts the holdable object to the holder under a negative pressure applied via the suction port.

Preferably, the plurality of holders include at least three holders.

Preferably, the plurality of holders are not aligned with the rotational axis.

Preferably, the circle around the rotational axis is smaller in diameter than the holdable object.

In accordance with another aspect of the present invention, there is provided a processing apparatus including a suction holding table including a base seat rotatable about a rotational axis, and a plurality of holders erected from the base seat and angularly spaced at equal angular intervals along a circle around the rotational axis, in which each of the holders has an upper surface functioning as a holding surface with a suction port defined therein and attracts the holdable object to the holder under a negative pressure applied via the suction port, an image capturing camera disposed above the suction holding table for capturing an image of the holdable object held on the suction holding table, a delivery unit for holding under suction the holdable object held on the suction holding table from above the holdable object, a holding unit for holding the holdable object, and a processing unit for processing the holdable object held on the holding unit. The delivery unit can deliver the holdable object from the suction holding table to the holding unit according to a delivering process determined on the basis of a position of the holdable object on the suction holding table that has been detected by using the image capturing camera.

Preferably, the delivery unit has a suction pad for holding the holdable object under suction and holds the holdable object while a center of the suction pad and a center of the holdable object are in alignment with each other.

The suction holding table according to the aspect of the present invention includes the base seat rotatable about the rotational axis, and the plurality of holders erected from the base seat and angularly spaced at the equal angular intervals along the circle around the rotational axis. Each of the holders has the upper surface functioning as the holding surface with the suction port defined therein and can attract the holdable object to the holder under the negative pressure applied via the suction port. In order for the suction holding table to hold the holdable object under suction thereon, the holdable object is placed on the holders. At this time, since the holdable object is placed on the holders in contact with the holding surfaces thereof irrespective of the state and magnitude of warpage of the holdable object, the holdable object is positioned closely to the suction ports of the holders. Therefore, the holders can easily attract the holdable object under the negative pressure applied via the suction ports. When the holders hold the holdable object under suction thereon, the holdable object on the holders is snugly seated on the holding surfaces in neat full face-to-face contact therewith under the negative pressure applied thereto, minimizing the warpage of the holdable object. Consequently, when an image of an outer circumferential edge of the holdable object is captured by the image capturing camera, the position of the holdable object can be specified accurately. It is also easy to hold the holdable object with the delivery unit. A delivering process of the delivery unit can be determined on the basis of the specified position of the holdable object, and the holdable object can be delivered to a predetermined position according to the determined delivering process so that the holdable object can accurately be processed by the processing unit.

According to the aspects of the present invention, there are thus provided a suction holding table capable of holding a warped holdable object under suction and a processing apparatus capable of processing the holdable object while accurately positioning the holdable object using the suction holding table.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
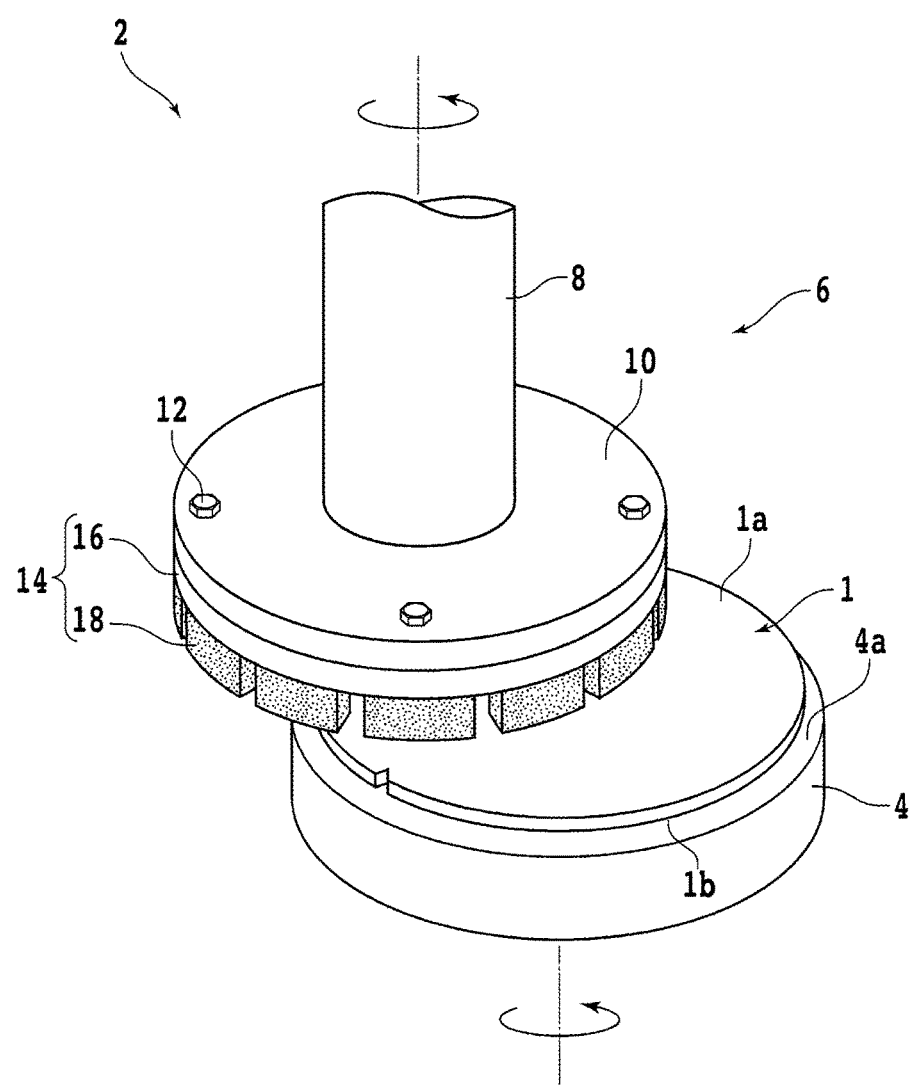
FIG. 1 is a perspective view schematically illustrating a holdable object that is processed by a processing unit.

A preferred embodiment of the present invention will be described hereinbelow with reference to the accompanying drawings. First, a holdable object that can be held under suction on a suction holding table according to the present embodiment will be described below. FIG. 1 schematically illustrates a holdable object 1 in perspective. The holdable object 1 includes a wafer substantially shaped as a circular plate made of silicon (Si), silicon carbide (SiC), gallium nitride (GaN), gallium arsenide (GaAs), or other semiconductor materials, for example. However, the holdable object 1 is not limited to those materials. The holdable object 1 has a plurality of devices such as ICs or LSI circuits formed in respective areas demarcated on a face side 1b thereof. A reverse side 1a of the holdable object 1, opposite the face side 1b, is ground to thin down the holdable object 1 to a predetermined thickness. Then, the thinned holdable object is divided along the areas into a plurality of device chips for use in electronic devices. The device chips are fabricated using various processing apparatus including a grinding apparatus for grinding a workpiece, a cutting apparatus for dividing a workpiece, a laser processing apparatus for dividing a workpiece, etc.

A grinding apparatus for grinding a workpiece will be described below as an example of a processing apparatus for processing the holdable object 1 as the workpiece. FIG. 1 schematically illustrates a grinding apparatus, i.e., a processing apparatus, 2 in perspective. The grinding apparatus 2 includes a holding unit, i.e., a chuck table, 4 for holding the workpiece under suction on a holding surface 4a thereof, and a grinding unit, i.e., a processing unit, 6 vertically movably disposed above the holding unit 4 for grinding the workpiece held under suction on the holding unit 4. The holding unit 4 has a porous member, not depicted, that is equal in diameter to the workpiece. The porous member is housed in a cavity defined centrally in an upper surface of the holding unit 4. The porous member has an upper surface functioning as the holding surface 4a. The holding unit 4 has a suction channel, not depicted, defined therein that has an end reaching a bottom surface of the porous member and another end connected to a suction source. When the workpiece is placed on the holding surface 4a and the suction source is actuated to generate and apply a negative pressure through the suction channel and the porous member to the workpiece, the workpiece is held under suction on the holding surface 4a of the holding unit 4.

The grinding unit 6 includes a spindle 8 extending generally perpendicularly to the holding surface 4a of the holding unit 4 and a wheel mount 10 shaped as a circular plate and fixed to a lower end of the spindle 8. The spindle 8 has an upper end connected to a rotary actuator, not depicted, such as an electric motor. When the rotary actuator is energized, it rotates the spindle 8 about its central axis.

The grinding unit 6 also includes a grinding wheel 14 fixed to a bottom surface of the wheel mount 10. The grinding wheel 14 includes an annular wheel base 16 having a central opening defined therein and an annular array of grindstones 18 disposed on a bottom surface of the wheel base 16. The wheel base 16 is made of a metal material such as aluminum. When the grinding wheel 14 is installed on the wheel mount 10, the wheel base 16 has its upper surface facing the bottom surface of the wheel mount 10. The wheel mount 10 has a plurality of axial through holes, not depicted, defined therein through which fasteners 12 such as bolts can be inserted. The wheel base 16 has a plurality of internally threaded holes, not depicted, defined in an upper surface thereof in alignment with the respective axial through holes in the wheel mount 10. When the upper surface of the wheel base 16 is held against the bottom surface of the wheel mount 10 and the fasteners 12 are inserted through the respective axial through holes in the wheel mount 10 and threaded into the internally threaded holes in the wheel base 16, the grinding wheel 14 is fastened to the grinding unit 6.

For grinding the workpiece on the grinding apparatus 2, the holding unit 4 is rotated about a rotational axis that is substantially perpendicular to the holding surface 4a and the rotary actuator connected to the upper end of the spindle 8 of the grinding unit 6 is energized to rotate the spindle 8 about its central axis. Therefore, the grindstones 18 of the grinding wheel 14 are rotated along an annular path around the rotational axis of the holding unit 4. Then, the grinding unit 6 is lowered to bring the bottom surfaces of the grindstones 18 into abrasive contact with an upper surface of the workpiece, i.e., the reverse side 1a of the holdable object 1, thereby grinding the workpiece.

In order to grind the workpiece in its entirety highly accurately to a predetermined thickness, it is necessary that the workpiece be positioned highly accurately in a predetermined position on the holding unit 4. More specifically, it is necessary that the position of the workpiece be adjusted so as to positionally align the center of the holding unit 4 and the center of the workpiece with each other and also the annular path along which the grindstones 18 of the grinding wheel 14 rotate pass through a point above the center of the workpiece. When the grinding apparatus 2 is in operation, it is loaded with a cassette housing a plurality of workpieces therein, and the workpieces are taken successively out of the cassette, placed on the holding unit 4, ground by the grinding unit 6, and put back into the cassette. Each of the workpieces brought out of the cassette is adjusted in position by a positioning unit, not depicted, before being delivered to the holding unit 4 by a delivery unit. The workpiece that has been accurately adjusted in position is then delivered to the holding unit 4 in a predetermined delivering process by the delivery unit and accurately positioned in a predetermined position on the holding surface 4a of the holding unit 4.

Heretofore, the positioning unit adjusts the position of the workpiece by moving a plurality of pins radially inwardly into abutting engagement of an outer circumferential edge of the workpiece. Workpieces such as semiconductor wafers to be processed by processing apparatus such as the grinding apparatus 2 may occasionally be warped depending on the material and thickness of the workpieces and the structural details of devices formed on the face sides thereof. It is not easy for the positioning unit to accurately position a warped and deformed workpiece in a predetermined position thereon. According to the present invention, a suction holding table is used to hold a workpiece as a holdable object 1 under suction thereon, an image of the holdable object 1 on the suction holding table is captured by an image capturing camera, and the position of an outer circumferential edge, center, or the like of the holdable object 1 is specified on the basis of the captured image. Then, a delivering process to be performed by the delivery unit is determined on the basis of the specified position, and the holdable object 1 is delivered to the holding unit 4 according to the determined delivering process by the delivery unit and accurately positioned in a predetermined position on the holding surface 4a of the holding unit 4.

Figure 2:
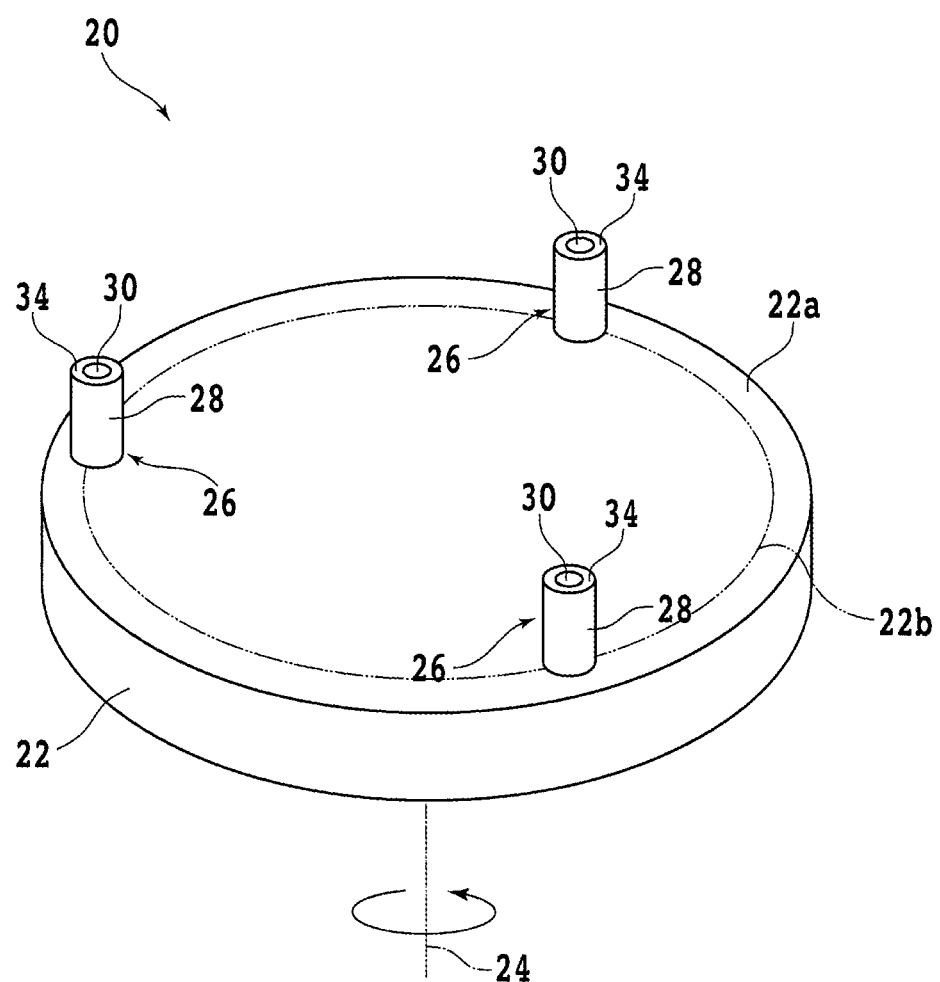
FIG. 2 is a perspective view schematically illustrating a suction holding table.
Figure 3A:
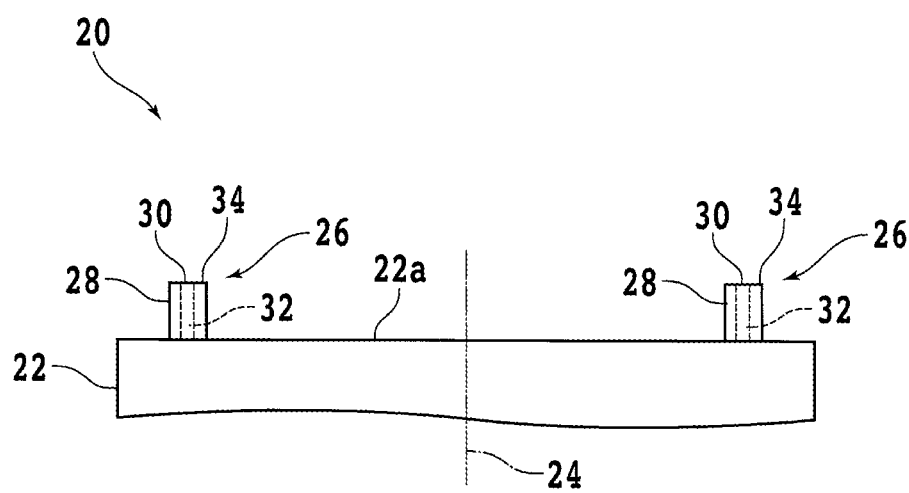
FIG. 3A a side elevational view schematically illustrating the suction holding table.

A suction holding table according to the present embodiment will be described below. FIG. 2 schematically illustrates in perspective the suction holding table, generally denoted by 20, according to the present embodiment. FIG. 3A schematically illustrates the suction holding table 20 in a side elevation. As illustrated in FIGS. 2 and 3A, the suction holding table 20 includes a base seat 22 and a plurality of holders 26 erected from an upper surface 22a of the base seat 22. The base seat 22 is shaped as a circular plate or cylinder that is commensurate in diameter with the holdable object 1. The base seat 22 has a bottom portion connected to a rotary actuator, not depicted, such as an electric motor. When the rotary actuator is energized, it rotates the base seat 22 about a rotational axis 24.

The holders 26 are arrayed or angularly spaced at equal angular intervals on the upper surface 22a along a circle 22b around the rotational axis 24. The holders 26 should preferably include at least three holders and more preferably three holders. The circle 22b around the rotational axis 24 is smaller in diameter than the holdable object 1. Preferably, the diameter of the circle 22b should preferably be larger than one half of the diameter of the holdable object 1. For example, when the holdable object 1 includes an Si wafer having a diameter of 8 inches, then the circle 22b should preferably have a diameter of approximately 130 mm. The holders 26 are not aligned with the rotational axis 24.

Each of the holders 26 includes a hollow cylindrical member having an upper surface functioning as a holding surface 34 with a suction port 30 defined therein. As illustrated in FIG. 3, each holder 26 has a suction channel 32 defined axially therethrough substantially perpendicularly to the upper surface 22a of the base seat 22. The upper end of the suction channel 32 reaches the suction port 30. The base seat 22 has a vent passage, not depicted, defined therein that has an end connected to a suction source, not depicted, such as a pump. The vent passage in the base seat 22 reaches the suction channels 32 in the respective holders 26. Alternatively, the base seat 22 may have as many vent passages, not depicted, defined therein as the number of the holders 26 and connected to the suction source and also to the respective suction channels 32. Stated otherwise, the suction holding table 20 may have a single suction system reaching the holders 26 or may have individual suction systems reaching the respective holders 26.

The height of each holder 26 should be larger than the magnitude of the warpage of a warped holdable object 1 to be placed on the holders 26. More specifically, the holders 26 should preferably be high enough to prevent a lowest portion of the face side 1b of the warped holdable object 1 from contacting the upper surface 22a of the base seat 22 when the holdable object 1 is placed on the holders 26, as described later on. However, since the magnitudes of the warpage of different kinds of warped holdable objects 1 are different from other, the height of each holder 26 may be determined in view of the magnitude of warpage that may occur in a holdable object 1 to be held under suction on the suction holding table 20. The holding surface 34 of each holder 26 should preferably, but not necessarily, have an outside diameter of 10 mm or less, for example. However, the diameter is not limited. The heights of all the holders 26 are equal to each other, so that the holding surfaces 34 thereof lie in one plane. As described later, a holdable object 1 is placed on the holders 26. When the suction source connected to the base seat 22 is then actuated, it applies a negative pressure through the vent passage in the base seat 22, the suction channels 32 in the holders 26, and the suction ports 30 therein to the holdable object 1 on the holding surfaces 34, attracting the holdable object 1 under suction on the holders 26.

Figure 4:
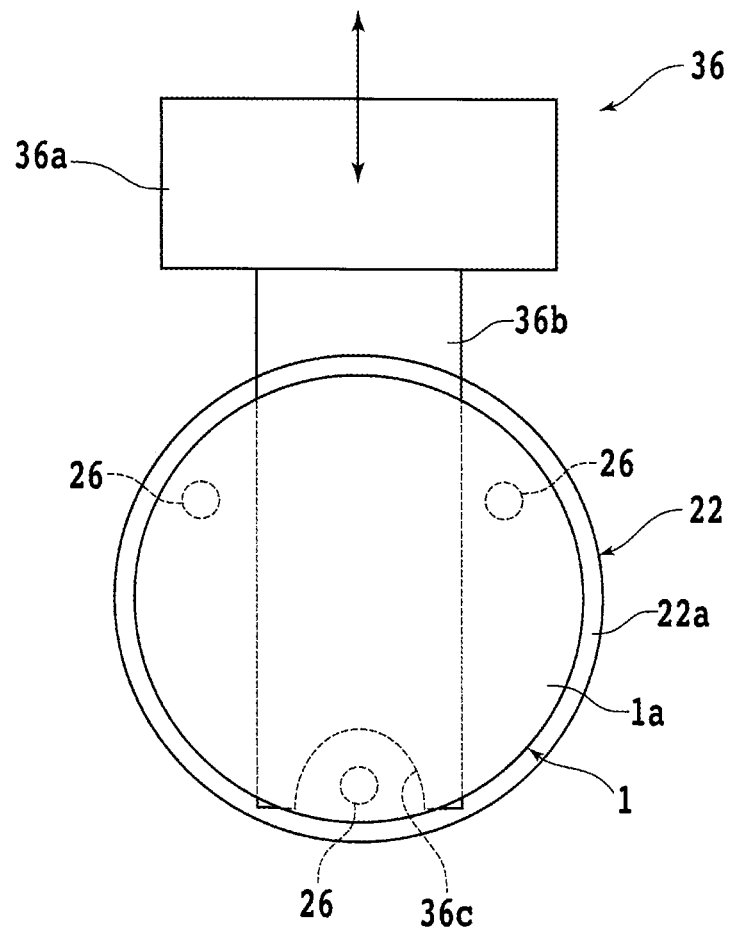
FIG. 4 is a plan view schematically illustrating the manner in which the holdable object is delivered onto the suction holding table by a first delivery unit.

As one of ways to use the suction holding table 20 according to the present embodiment, there will be described below a process of delivering a holdable object 1 to the suction holding table 20 and holding the holdable object 1 under suction on the suction holding table 20. For example, in a case where the suction holding table 20 is incorporated in a processing apparatus, e.g., the grinding apparatus 2, a holdable object 1 is housed as a workpiece to be processed by the processing apparatus in the cassette and delivered into the processing apparatus. FIG. 4 schematically illustrates in plan the manner in which the holdable object 1 is delivered onto the suction holding table 20 by a first delivery unit 36. The first delivery unit 36 is included in the processing apparatus for taking the holdable object 1 out of the cassette and delivering the holdable object 1 onto the suction holding table 20. The first delivery unit 36 includes a movable portion 36a and a plate-shaped support portion 36b having an end supported on the movable portion 36a. The movable portion 36a is movable toward and away from the cassette and the suction holding table 20 and is also liftable and lowerable. The movable portion 36a is movable to move the support portion 36b to a predetermined position.

The first delivery unit 36 unloads the holdable object 1 out of the cassette by introducing the support portion 36b below the holdable object 1 in the cassette, lifting the unloaded holdable object 1, and retracting the support portion 36b away from the cassette. As illustrated in FIG. 4, the first delivery unit 36 delivers the holdable object 1 to a position above the suction holding table 20. At this time, the holdable object 1 is positioned in covering relation to an area above the holders 26 of the suction holding table 20 and overlaps the upper surface 22a of the base seat 22. At this time, as illustrated in FIG. 4, the direction in which the support portion 36b is introduced and the orientation of the base seat 22 of the suction holding table 20 are adjusted in order to prevent the support portion 36b from overlapping the holders 26. The support portion 36b may have a recess 36c defined in its distal end portion to have the distal end portion stay clear of one of the holders 26.

Figure 3B:
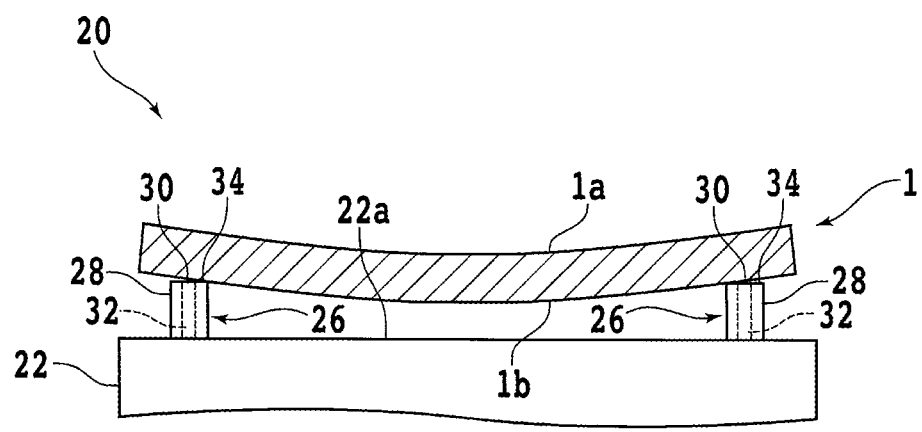
FIG. 3B is a cross-sectional view schematically illustrating a warped holdable object that is placed on the suction holding table.

Thereafter, the first delivery unit 36 lowers the holdable object 1 by lowering the support portion 36b. When lowered, the holdable object 1 is placed on the holders 26 and released from the support portion 36b. Then, the first delivery unit 36 pulls the support portion 36b away from the suction holding table 20 by retracting the movable portion 36a, thereby leaving the holdable object 1 on the holders 26 of the suction holding table 20. FIG. 3B schematically illustrates a warped holdable object 1 that is placed on the suction holding table 20 in cross section. As illustrated in FIG. 3B, the warped holdable object 1 has an outer circumferential portion curved upwardly and a central portion lowered into a downwardly concave configuration, and the holders 26 support outer portions of the holdable object 1 that are positioned away from the central portion of the holdable object 1. Since the reverse side 1a of the holdable object 1 is held in contact with respective ends of the holding surfaces 34 of the holders 26, the supported outer portions of the holdable object 1 are positioned closely to the suction ports 30 in the holders 26. When the suction source connected to the suction channels 32 in the holders 26 is actuated, the negative pressure generated by the suction source is applied through the suction channels 32 and the suction ports 30 to the holdable object 1 on the holding surfaces 34, attracting the holdable object 1 to the holders 26 under the negative pressure applied via the suction ports 30.

Figure 5A:
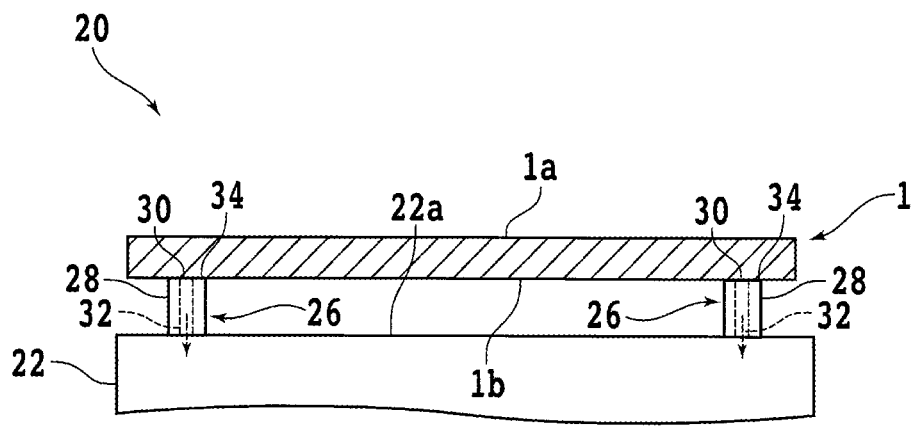
FIG. 5A is a cross-sectional view schematically illustrating the holdable object held under suction on the suction holding table.

FIG. 5A schematically illustrates, in cross section, the holdable object 1 held under suction on the suction holding table 20. As illustrated in FIG. 5A, the holdable object 1 attracted to the holders 26 under the negative pressure applied via the suction ports 30 is progressively deformed to displace the supported outer portions thereof toward the suction ports 30 until the supported outer portions close the suction ports 30. Specifically, the supported outer portions of the holdable object 1 on the holders 26 are displaced toward the holding surfaces 34 whereas the central portion of the holdable object 1 is lifted upwardly. As a consequence, the reverse side 1a of the holdable object 1 contacts the entire holding surfaces 34 of the holders 26, whereupon the supported outer portions of the holdable object 1 are snugly seated on the holding surfaces 34 in neat full face-to-face contact therewith. Finally, the holdable object 1 is held under suction on the suction holding table 20 with its warpage held to a minimum. The suction holding table 20 according to the present embodiment does not support the central portion of the holdable object 1 in physical contact therewith but keeps the central portion of the holdable object 1 floating over the base seat 22. The suction holding table 20 keeps the holdable object 1 in contact with the holding surfaces 34 of the holders 26 irrespective of the state and magnitude of warpage of the holdable object 1. At this time, inasmuch as the supported outer portions of the holdable object 1 on the holders 26 are positioned closely to the suction ports 30, the holders 26 can easily attract the holdable object 1 under the negative pressure applied via the suction ports 30. When the holders 26 hold the holdable object 1 under suction thereon, the supported outer portions of the holdable object 1 on the holders 26 are snugly seated on the holding surfaces 34 in neat full face-to-face contact therewith under the negative pressure applied thereto, minimizing the warpage of the holdable object 1.

As the suction holding table 20 according to the present embodiment can secure the holdable object 1 by holding it under suction and can also reduce warpage that the holdable object 1 suffers, it is possible to accurately detect the position of an outer circumferential edge of the holdable object 1, for example, by capturing an image of the outer circumferential edge of the holdable object 1. It is also possible to accurately specify the position of the center of the holdable object 1 on the basis of the accurately detected position of the outer circumferential edge of the holdable object 1. In addition, when the holdable object 1 is to be delivered from the suction holding table 20 to the holding unit 4 (see FIG. 1), it is easy for the delivery unit to hold the holdable object 1 providing the warpage of the holdable object 1 is reduced. By determining a delivering process to be performed by the delivery unit on the basis of the specified position of the holdable object 1, it is possible to accurately deliver the holdable object 1 to a predetermined position on the holding unit 4, so that the holdable object 1 can accurately be processed by the grinding unit 6.

Figure 5B:
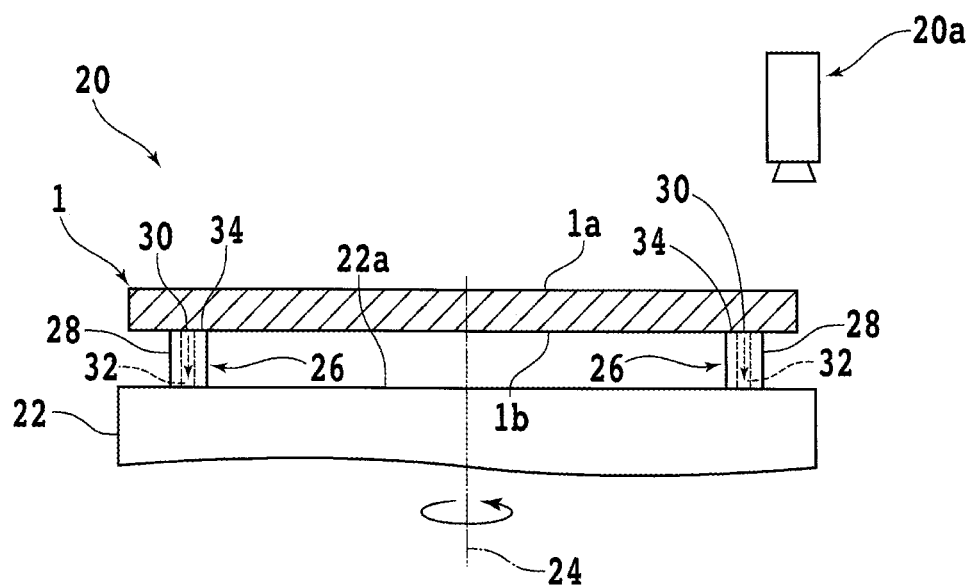
FIG. 5B is a cross-sectional view schematically illustrating the holdable object held under suction on the suction holding table when an image of the holdable object is captured by an image capturing camera.

A process of detecting the position of the holdable object 1 with an image capturing camera and a process of unloading the holdable object 1 from the suction holding table 20 will be described below. FIG. 5B schematically illustrates, in cross section, the holdable object 1 held under suction on the suction holding table 20 when an image of the holdable object 1 is captured by an image capturing camera 20a. As illustrated in FIG. 5B, the image capturing camera 20a is disposed above an outer circumferential edge of the base seat 22 of the suction holding table 20 and directed downwardly. The image capturing camera 20a includes an image capturing device such as a charge coupled device (CCD) sensor or a complementary metal oxide semiconductor (CMOS) sensor. The image capturing camera 20a is used to capture an image of an outer circumferential edge, at a certain position, of the holdable object 1 held on the suction holding table 20, and the captured image is processed according to a predetermined image processing process. The outer circumferential edge at the certain position of the holdable object 1 in the processed image is detected and the position of the outer circumferential edge of the holdable object 1 on the suction holding table 20 is specified. Thereafter, the rotary actuator connected to the base seat 22 is actuated to turn the base seat 22 through a predetermined angle about the rotational axis 24, allowing the image capturing camera 20a to switch to a different position where it can capture an image of an outer circumferential edge of the holdable object 1 on the suction holding table 20. The above cycle is repeated until the image capturing camera 20a captures images of outer circumferential edges at a plurality of positions of the holdable object 1, and the positions of the outer circumferential edges of the holdable object 1 are specified. The position of a certain portion of the holdable object 1 on the suction holding table 20, e.g., the position of the center of the holdable object 1, can be specified from the specified positions of the outer circumferential edges of the holdable object 1.

Figure 6:
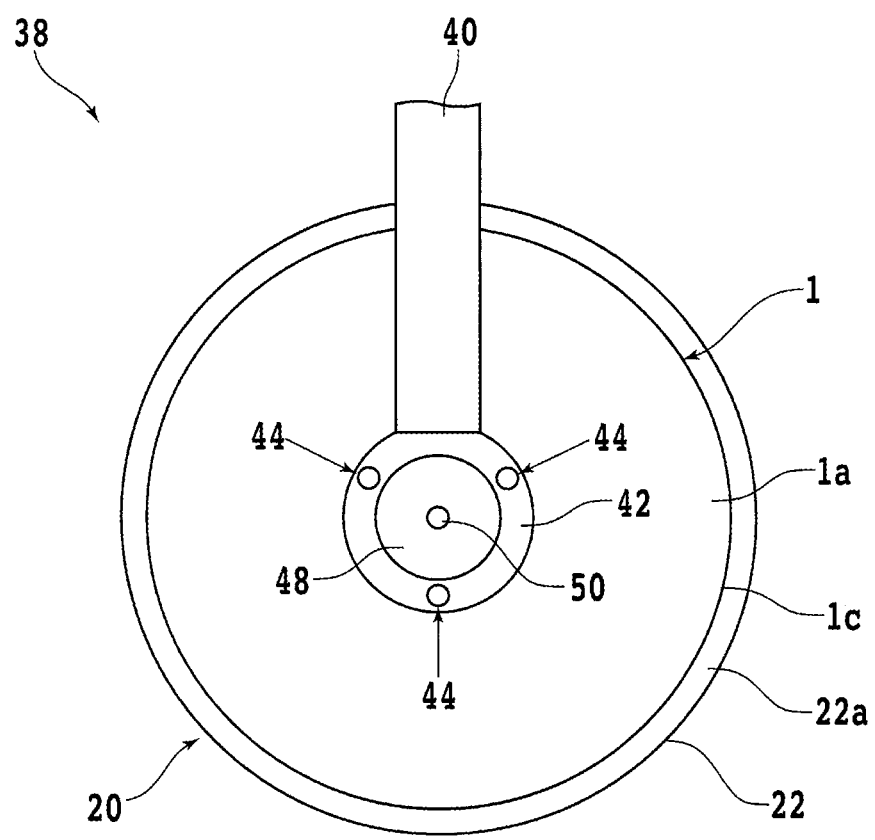
FIG. 6 is a plan view schematically illustrating a second delivery unit for delivering a holdable object from the suction holding table.
Figure 7:
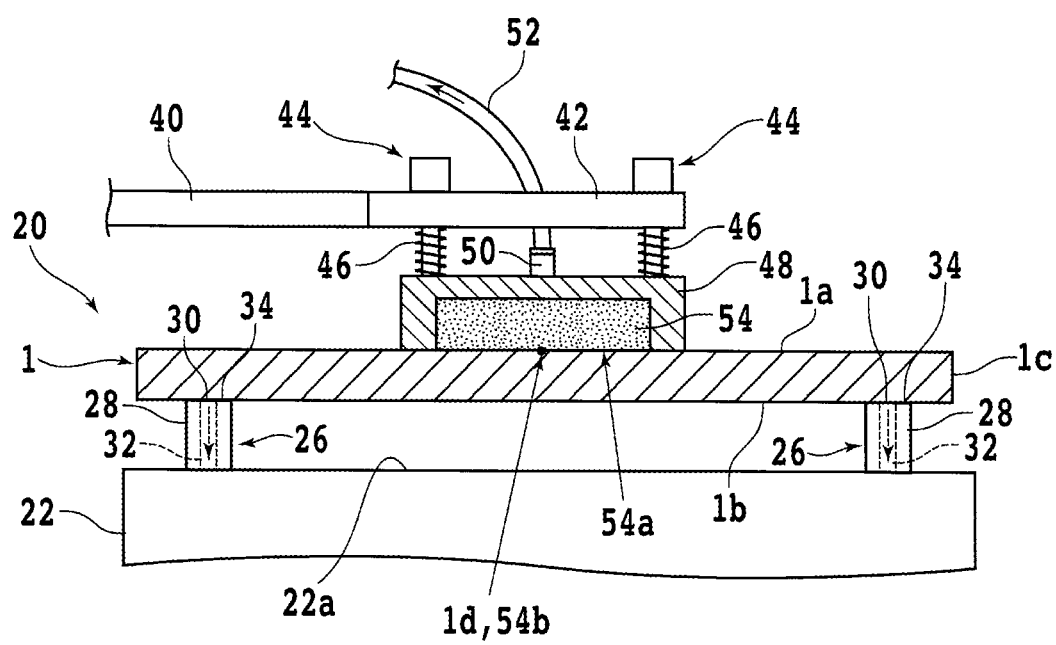
FIG. 7 is a side elevational view schematically illustrating the holdable object held under suction by the second delivery unit over the suction holding table.

FIG. 6 schematically illustrates, in plan, a second delivery unit 38 for delivering a holdable object 1 as a workpiece to be processed by the grinding unit, i.e., the processing unit, 6 to the holding unit 4 from the suction holding table 20. FIG. 7 schematically illustrates, in cross section, the holdable object 1 held under suction by the second delivery unit 38 over the suction holding table 20. The second delivery unit 38 will be described below with reference to FIGS. 6 and 7. The second delivery unit 38 includes an arm 40 extending substantially parallel to the upper surface 22a of the base seat 22 of the suction holding table 20 and a support body 42 fixed to a distal end of the arm 40. The arm 40 has a proximal end fixed to a shaft. When the shaft is rotated about its central axis, the arm 40 is angularly moved to move the support body 42 between a position above the suction holding table 20 and a position above the holding unit 4.

The support body 42 includes an annular member that is smaller in diameter than the holdable object 1 and has a plurality of vertical through holes defined therein at respective angularly spaced positions. Respective pins 44 are vertically movably inserted in and extend through the through holes. The pins 44 include respective cylindrical rods that are smaller in diameter than the through holes and respective heads mounted on respective ends of the cylindrical rods. The heads are larger in diameter than the through holes. The pins 44 are supported on the support body 42 when the heads rest on an upper surface of the support body 42 around the upper ends of the through holes. The cylindrical rods of the pins 44 have respective lower ends secured to a suction pad 48 that is shaped as a circular plate. Resilient members 46 such as helical compression springs are disposed respectively around the cylindrical rods of the pins 44. The resilient members 46 have upper ends held against a lower surface of the support body 42 and lower ends held against an upper surface of the suction pad 48. When an upward force is applied to the suction pad 48, the cylindrical rods of the pins 44 are lifted in the respective through holes in the support body 42, lifting the heads of the pins 44 off the support body 42 and compressing the resilient members 46 that exert downward repulsive forces on the suction pad 48.

The suction pad 48 houses a porous member 54 therein that has a lower surface exposed downwardly. The porous member 54 is held in fluid communication with a suction channel, not depicted, defined in and extending vertically through the suction pad 48. The suction channel reaches a joint 50 disposed centrally on the upper surface of the suction pad 48 and connected to an end of a suction tube 52. The other end of the joint 50 is connected to a suction source, not depicted.

In order for the second delivery unit 38 to hold the holdable object 1 held under suction on the suction holding table 20 and deliver the holdable object 1 from the suction holding table 20, the arm 40 is angularly moved to move the suction pad 48 and put the suction pad 48 on the reverse side, i.e., the upper surface, 1a of the holdable object 1. At this time, the porous member 54 has its center 54b aligned with the center, denoted by 1d, of the holdable object 1 whose position has been specified on the basis of an image captured by the image capturing camera 20a illustrated in FIG. 7.

Then, the suction source connected to the suction tube 52 is actuated to generate and apply a negative pressure through the suction tube 52 and the porous member 54 to the holdable object 1, enabling the suction pad 48 to hold the holdable object 1 under suction. Thereafter, the suction source connected to the suction channels 32 in the holders 26 of the suction holding table 20 is inactivated to release the holdable object 1 from the suction holding table 20. Then, the arm 40 is lifted to unload the holdable object 1 from the suction holding table 20 and angularly moved to deliver the holdable object 1 to the holding unit 4 (see FIG. 1). At this time, the second delivery unit 38 delivers the holdable object 1 in order to bring the center 1d of the holdable object 1 into alignment with the center of the holding surface 4a of the holding unit 4. Then, the holding unit 4 holds the holdable object 1 under suction, and the suction pad 48 of the second delivery unit 38 releases the holdable object 1. Since the holdable object 1 is held under suction on the holding unit 4 while the center 1d of the holdable object 1 is in alignment with the center of the holding surface 4a of the holding unit 4, the grinding unit, i.e., the processing unit, 6 is able to process the holdable object 1 appropriately.

As described above, the second delivery unit 38 delivers the holdable object 1 from the suction holding table 20 to the holding unit 4 according to the delivering process determined on the basis of the position of the holdable object 1 on the suction holding table 20 that has been detected by using the image capturing camera 20a. Therefore, using the grinding apparatus, i.e., the processing apparatus, 2 having the suction holding table 20 and capable of positioning the holdable object 1 using the suction holding table 20, it is possible to process a warped holdable object 1 while the warped holdable object 1 is accurately positioned.

According to the above embodiment, the second delivery unit 38 delivers the holdable object 1 while the center 54b of the porous member 54 of the suction pad 48 is being aligned with the center 1d of the holdable object 1. However, the present invention is not limited to such details. Even when the center 54b of the porous member 54 of the suction pad 48 is not aligned with the center 1d of the holdable object 1, the second delivery unit 38 may deliver the holdable object 1 in order to bring the center 1d of the holdable object 1 into alignment with the center of the holding surface 4a of the holding unit 4. In this case, a delivering process of the second delivery unit 38 is determined to deliver the holdable object 1 in such a way. According to the above embodiment, moreover, the suction pad 48 of the second delivery unit 38 holds a region of the holdable object 1 that includes the center 1d thereof. However, the present invention is not limited to such details. For example, the suction pad 48 of the second delivery unit 38 may include an annular suction pad shaped in overlapping relation to the circle 22b along which the holders 26 of the suction holding table 20 are arrayed or angularly spaced. In this case, since the annular suction pad can hold under suction a region of the holdable object 1 where the warpage has been corrected maximally on the holders 26, the second delivery unit 38 can deliver the holdable object 1 with increased accuracy.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A suction holding table for holding a holdable object under suction thereon, comprising:
   a base seat rotatable about a rotational axis; and
   a plurality of holders erected from, and in contact with, an upper surface of the base seat and angularly spaced at equal angular intervals along a circle around the rotational axis,
   wherein each of the holders has an upper surface functioning as a holding surface with a suction port defined therein and attracts the holdable object to the holder under a negative pressure applied via the suction port.

2. The suction holding table according to claim 1, wherein the plurality of holders include at least three holders.

3. The suction holding table according to claim 1, wherein the plurality of holders are not aligned with the rotational axis.

4. The suction holding table according to claim 1, wherein the circle around the rotational axis is smaller in diameter than the holdable object.

5. A processing apparatus comprising:
   a suction holding table including a base seat rotatable about a rotational axis, and a plurality of holders erected from the base seat and angularly spaced at equal angular intervals along a circle around the rotational axis, in which each of the holders has an upper surface functioning as a holding surface with a suction port defined therein and attracts the holdable object to the holder under a negative pressure applied via the suction port;
   an image capturing camera disposed above the suction holding table for capturing an image of the holdable object held on the suction holding table;
   a delivery unit for holding under suction the holdable object held on the suction holding table from above the holdable object;
   a holding unit for holding the holdable object; and
   a processing unit for processing the holdable object held on the holding unit,
   wherein the delivery unit delivers the holdable object from the suction holding table to the holding unit according to a delivering process determined on a basis of a position of the holdable object on the suction holding table that has been detected by using the image capturing camera.

6. The processing apparatus according to claim 5,
   wherein the delivery unit has a suction pad for holding the holdable object under suction, and holds the holdable object while a center of the suction pad and a center of the holdable object are in alignment with each other.

7. The suction holding table according to claim 1, wherein each of the plurality of holders includes a hollow cylindrical member.

8. The suction holding table according to claim 1, wherein each of the holders has a suction channel defined axially therethrough substantially perpendicularly to the upper surface of the base seat, and
   wherein the upper end of the suction channel reaches the suction port.

9. The suction holding table according to claim 1, wherein the circle around the rotational axis has a diameter larger than one half of a diameter of the holdable object.

10. The suction holding table according to claim 1, wherein a reverse side of the holdable object contacts an entirety of the holding surface of each of the holders.

11. A suction holding table for holding a holdable object under suction thereon, comprising:
    a base seat rotatable about a rotational axis; and
    a plurality of holders erected from, and in contact with, an upper surface of the base seat and angularly spaced at equal angular intervals along a circle around the rotational axis,
    wherein each of the holders has an upper surface functioning as a holding surface with a suction port defined therein and attracts the holdable object to the holder under a negative pressure applied via the suction port, and
    wherein the suction holding table does not support a central portion of the holdable object in physical contact therewith.

12. The suction holding table according to claim 11, wherein each of the holders has a suction channel defined axially therethrough substantially perpendicularly to the upper surface of the base seat, and
    wherein the upper end of the suction channel reaches the suction portion.

13. The suction holding table according to claim 11, wherein each of the plurality of holders includes a hollow cylindrical member.

14. The suction holding table according to claim 11, wherein a height of each holder is larger than a magnitude of the warpage of a warped holdable object to be placed on the holders.

15. The suction holding table according to claim 11, wherein the circle around the rotational axis has a diameter larger than one half of a diameter of the holdable object.

16. The suction holding table according to claim 11, wherein a reverse side of the holdable object contacts an entirety of the holding surface of each of the holders.

17. The suction holding table according to claim 11, wherein the plurality of holders include at least three holders.

18. The suction holding table according to claim 11, wherein the plurality of holders are not aligned with the rotational axis.

19. The suction holding table according to claim 11, wherein the circle around the rotational axis is smaller in diameter than the holdable object.

* * * * *